(12) United States Patent
Lee (10) Patent No.: US 9,362,532 B2
(45) Date of Patent: Jun. 7, 2016

(54) APPARATUS AND METHOD FOR ABLATING SUBSTRATE AND METHOD OF FABRICATING DISPLAY APPARATUS

(71) Applicant: Seong Ryong Lee, Yongin (KR)

(72) Inventor: Seong Ryong Lee, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 398 days.

(21) Appl. No.: 13/853,138

(22) Filed: Mar. 29, 2013

(65) Prior Publication Data

US 2014/0147577 A1    May 29, 2014

(30) Foreign Application Priority Data

Nov. 29, 2012   (KR) ........................ 10-2012-0137331

(51) Int. Cl.
| | |
|---|---|
| *B05D 5/12* | (2006.01) |
| *H01L 51/56* | (2006.01) |
| *H01L 51/00* | (2006.01) |

(52) U.S. Cl.
CPC ............... *H01L 51/56* (2013.01); *H01L 51/003* (2013.01); *H01L 51/0009* (2013.01)

(58) Field of Classification Search
USPC ...................................................... 264/408
See application file for complete search history.

(56) References Cited

U.S. PATENT DOCUMENTS

| | | | |
|---|---|---|---|
| 5,501,944 A * | 3/1996 | Hill et al. ...................... | 430/321 |
| 8,309,379 B2 | 11/2012 | Park et al. | |
| 2010/0038035 A1 * | 2/2010 | Noda et al. ................. | 156/379.6 |
| 2011/0052836 A1 * | 3/2011 | Kim et al. ...................... | 428/1.1 |
| 2011/0290406 A1 * | 12/2011 | Dang et al. .................... | 156/155 |
| 2014/0326416 A1 * | 11/2014 | Landru .......................... | 156/712 |

FOREIGN PATENT DOCUMENTS

| | | |
|---|---|---|
| JP | 2001-221744 A | 8/2001 |
| JP | 2004-228486 A | 8/2004 |
| KR | 10-2010-0068661 A | 6/2010 |
| KR | 10-2011-0029820 A | 3/2011 |

* cited by examiner

*Primary Examiner* — Austin Murata (74) *Attorney, Agent, or Firm* — Lee & Morse, P.C.

(57) ABSTRACT

An apparatus for ablating a substrate of a display apparatus, the apparatus including a stage, the stage being configured to receive thereon a carrier substrate, the carrier substrate having attached thereto the display apparatus, a light source unit, the light source unit being configured to emit light towards the stage, a measuring unit, the measuring unit being configured to measure a transmittance of the carrier substrate, and a control unit, the control unit being configured to control the light source unit to emit light sufficient to ablate the substrate of the display apparatus according to the transmittance of the carrier substrate as measured by the measuring unit.

13 Claims, 6 Drawing Sheets

FIG. 12

APPARATUS AND METHOD FOR ABLATING SUBSTRATE AND METHOD OF FABRICATING DISPLAY APPARATUS

CROSS-REFERENCE TO RELATED PATENT APPLICATION

This application claims the benefit of Korean Patent Application No. 10-2012-0137331, filed on Nov. 29, 2012, in the Korean Intellectual Property Office, the disclosure of which is incorporated herein in its entirety by reference.

BACKGROUND

1. Field

Embodiments relate to an apparatus and method for ablating a substrate and a method of manufacturing a display apparatus.

2. Description of the Related Art

Recently, thin flat panel display devices have gained popularity due to their large screen and portability. Among the flat panel display devices, organic or inorganic light-emitting displays that are self-emissive and provide a wide viewing angle, high contrast, and high response rate are receiving considerable attention as a promising candidate for next-generation displays. Furthermore, an organic light-emitting display (OLED) having a light-emitting layer of an organic compound offers high brightness and response rate, low driving voltage, and high color rendering, compared to an inorganic light-emitting display. An OLED may also achieve flexibility by using a flexible plastic substrate.

SUMMARY

Embodiments are directed to an apparatus for ablating a substrate of a display apparatus, the apparatus including a stage, the stage being configured to receive thereon a carrier substrate, the carrier substrate having attached thereto the display apparatus, a light source unit, the light source unit being configured to emit light towards the stage, a measuring unit, the measuring unit being configured to measure a transmittance of the carrier substrate, and a control unit, the control unit being configured to control the light source unit to emit light sufficient to ablate the substrate of the display apparatus according to the transmittance of the carrier substrate as measured by the measuring unit.

The measuring unit may includes a light receiving unit which is disposed on the stage and receives incident light emitted by the light source unit and receives transmitted light corresponding to the incident light transmitted through the carrier substrate, and a calculator for calculating the transmittance of the carrier substrate by using the incident light and the transmitted light.

The control unit may include a determiner for determining an energy density of light sufficient to ablate the substrate of the display apparatus according to the transmittance of the carrier substrate, and a light source controller for controlling the light source unit to emit light having the energy density determined by the determiner.

The control unit may further include a storage for storing a table containing energy densities of light sufficient to ablate the substrate of the display apparatus and transmittances of the carrier substrate mapped to the energy densities, and the energy densities may be inversely proportional to the transmittances of the carrier substrate, and the determiner may determine the energy density by using the table stored in the storage.

The apparatus may further include a transport unit configured to move the stage relative to the light source unit.

The light source unit may include an optical system for converting initial light into light shaped as a line beam.

The light may be provided so as to be incident on the carrier substrate.

Embodiments are also directed to a method of ablating a substrate of a display apparatus, the method including positioning a carrier substrate on a stage, the carrier substrate having attached thereto the display apparatus, measuring a transmittance of the carrier substrate, determining second light sufficient to ablate the substrate of the display apparatus according to the measured transmittance of the carrier substrate, and emitting the second light from the light source unit to ablate the substrate of the display apparatus.

The stage may moves relative to the light source unit.

The method may further include, before the positioning of the carrier substrate, receiving first light at a light receiving unit when the stage is located at a first position. The measuring of the transmittance may include receiving third light at the light receiving unit, the third light being generated after the first light, the third light being transmitted through the carrier substrate when the stage is located at the first position, and calculating the transmittance of the carrier substrate by using the first light and the third light.

In the ablating of the substrate of the display apparatus, the second light may be emitted as the stage moves in a first direction from the first position and ablates the substrate of the display apparatus.

In the determining of the second light, an energy density of the second light sufficient to ablate the substrate of the display apparatus may be determined according to the transmittance of the carrier substrate.

The second light may be emitted on an interface between the carrier substrate and the substrate of the display apparatus.

One of the first light and the second light may be incident from the carrier substrate.

The second light may have a line beam shape and a width greater than or equal to a width of the display apparatus.

Embodiments are also directed to a method of manufacturing a display apparatus, the method including forming a plastic substrate on a carrier substrate, fabricating a display apparatus by forming an organic light-emitting device on the plastic substrate, positioning the display apparatus with the carrier substrate attached thereto on a stage, measuring a transmittance of the carrier substrate, determining second light sufficient to ablate the plastic substrate according to the measured transmittance of the carrier substrate, and emitting the second light from the light source unit to ablate the plastic substrate.

The stage may move relative to the light source unit.

The method may further include, before the positioning of the display apparatus, receiving first light from a light receiving unit when the stage is located at a first position. The measuring of the transmittance may include receiving third light at the light receiving unit, the third light being generated after the first light, the third light being transmitted through the carrier substrate when the stage is located at the first position, and calculating the transmittance of the carrier substrate by using the first light and the third light.

In the ablating of the plastic substrate, the second light may be emitted as the stage moves in a first direction from the first position and ablates the plastic substrate.

In the determining of the second light, an energy density of the second light sufficient to ablate the plastic substrate may be determined according to the transmittance of the carrier substrate.

The second light may be emitted on an interface between the carrier substrate and the plastic substrate.

The fabricating of the display apparatus may further include forming a sealing film for sealing the organic light-emitting device and forming a protective film on the sealing film.

BRIEF DESCRIPTION OF THE DRAWINGS

The above and other features and advantages will become more apparent by describing in detail example embodiments thereof with reference to the attached drawings in which.

DETAILED DESCRIPTION

Example embodiments of the invention will now be described more fully hereinafter with reference to the accompanying drawings, in which example embodiments of the invention are shown In the drawings, dimensions of respective elements may be exaggerated, omitted, or schematically illustrated for convenience of explanation and clarity, and the size of each element does not entirely reflect an actual size.

It will be understood that, although the terms first, second, etc. may be used herein to describe various elements, these elements should not be limited by these terms. These terms are only used to distinguish one element from another element.

It will also be understood that when an element is referred to as being "on," "above," "beneath," and "below," it can be directly on the other element or intervening elements may also be present. The spatial orientations may be described with reference to the accompanying drawings.

In the drawings, like numbers refer to like elements throughout.

As used herein, the term "and/or" includes any and all combinations of one or more of the associated listed items. Expressions such as "at least one of," when preceding a list of elements, modify the entire list of elements and do not modify the individual elements of the list.

Figure 1:
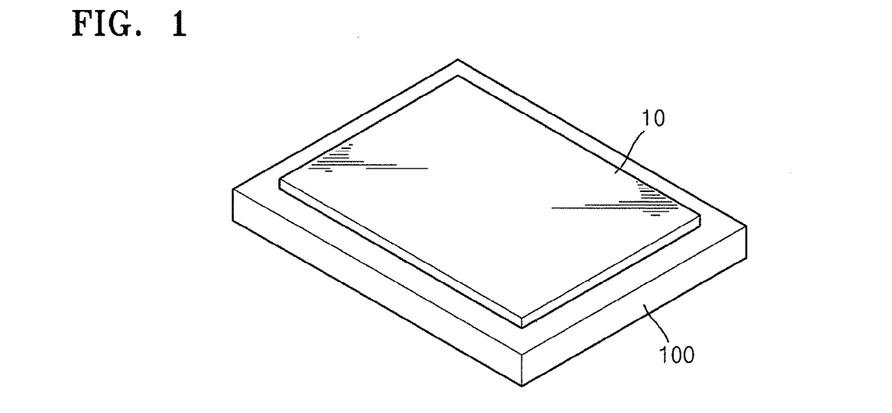
FIGS. 1 through 3 schematically illustrate steps of a method of manufacturing a display apparatus according to an embodiment.
Figure 2:
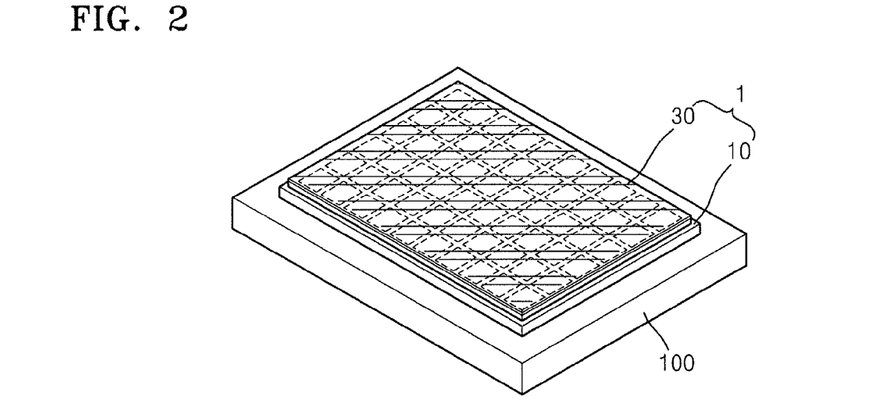
Figure 3:
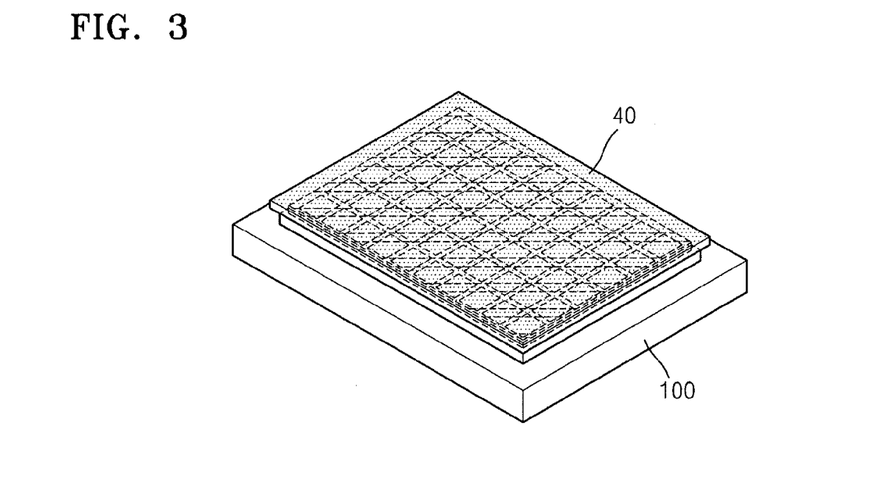
Figure 4:
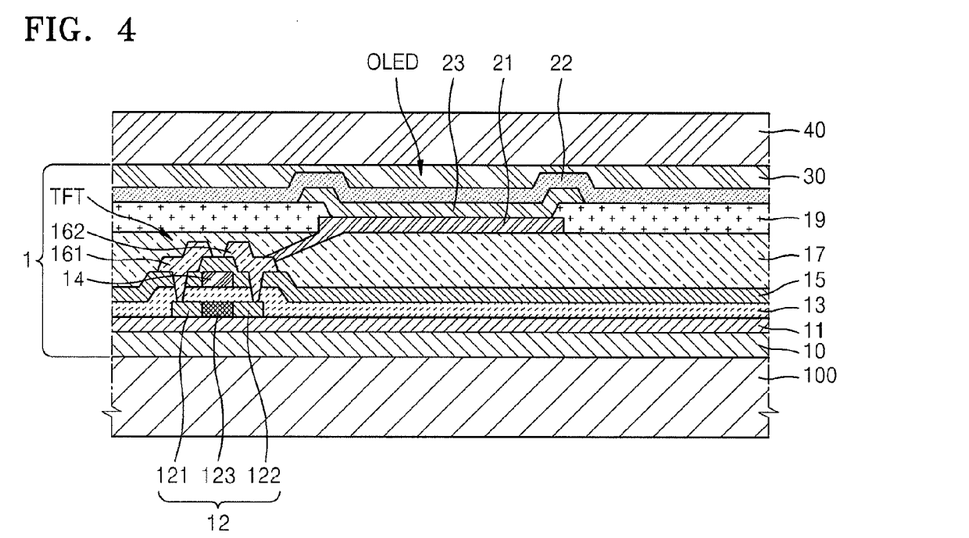
FIG. 4 is a cross-sectional view taken along line IV-IV of FIG. 3.

FIGS. 1 through 3 schematically illustrate a method of manufacturing a display apparatus 1 according to an embodiment. FIG. 4 is a cross-sectional view taken along line IV-IV of FIG. 3.

Although FIGS. 1 through 4 show that the display apparatus 1 includes one thin-film transistor (TFT) and one organic light-emitting diode (OLED), the display apparatus 1 may include a plurality of TFTs and a plurality of OLEDs arranged in an array. The display apparatus 1 may further include capacitors (not shown) and a plurality of wires (not shown).

In the example embodiment shown in FIGS. 1 through 4, a carrier substrate 100 is prepared. The carrier substrate 100 is made of a rigid material to provide a support in a process of fabricating the display apparatus 1. The carrier substrate 100 is also formed of a transparent material so that light passes therethrough in a subsequent detaching process. For example, the carrier substrate 100 may be made of glass containing silicon dioxide ($SiO_2$) as a main ingredient. Otherwise, the carrier substrate 100 may be formed of at least one of borosilicate glass, fused silica glass, or quartz glass.

Next, the display apparatus 1 is formed on the carrier substrate 100, and includes a lower substrate and a TFT array and OLEDs disposed on the lower substrate. The display apparatus 1 may further include a sealing film 30 for sealing the OLEDs. A process of forming the display apparatus 1 on the carrier substrate 100 will now be described in more detail.

First, a plastic substrate 10 is formed on the carrier substrate 100. The plastic substrate 10 is made of a plastic material which is light weight due to its low specific gravity and flexible to achieve a curved surface, compared to a conventional glass substrate. For example, the plastic substrate 10 may be formed of polyimide which is heat resistant to sustain a high temperature process including a low temperature poly silicon (LTPS) thin film transistor (TFT) manufacturing method and is flexible in the form of a film. The plastic substrate 10 may be formed by spin coating a polyimide solution on the carrier substrate 100 and curing the polyimide solution. Alternatively, the plastic substrate 10 may be formed by attaching a polyimide film substrate onto the carrier substrate 100 with an adhesive material or laminating the polyimide film on the substrate.

The carrier substrate 100 has a larger area than the plastic substrate 10. For example, the carrier substrate 100 may be overlapped by the entire surface of the plastic substrate 10 and project beyond at least one side of the plastic substrate 10. This facilitates measurement of transmittance of the carrier substrate 100 without moving a stage 210 in a subsequent ablation operation with an apparatus 200.

A buffer layer 11 is formed on the plastic substrate so as to provide a flat surface and prevent invasion of contaminants. The buffer layer 11 may be formed by depositing $SiO_2$ and/or $SiN_x$ on the plastic substrate 10 using various deposition techniques such as plasma enhanced chemical vapor deposition (PECVD), atmospheric pressure chemical vapor deposition (APCVD), and low pressure CVD (LPCVD).

A TFT is formed on the buffer layer 11, and is electrically connected to an OLED to drive the OLED. While FIG. 4 shows that the TFT is a top gate type transistor and sequentially includes an active layer 12, a gate electrode 14, and source and drain electrodes 161 and 162, embodiments are not limited thereto, and the TFT may be a bottom gate type transistor or other various types of transistors.

The active layer 12 overlying the buffer layer 11 may be formed of an organic semiconductor or oxide semiconductor containing, e.g., one or more of amorphous silicon, crystalline silicon, indium (In), gallium (Ga), tin (Sn), zinc (Zn), or hafnium (Hf). The active layer 12 includes a source region 121 and a drain region 122, which are in contact with the source electrode 161 and the drain electrode 162, respectively, and a channel region 123 disposed between the source and drain regions 121 and 122. The source and drain regions 121 and 122 are positioned at both sides of the active layer 12 and may be doped with impurities depending on the application.

A gate insulating layer 13 overlying the active layer 12 may be composed of a single or multiple layers of an inorganic material such as $SiO_2$ and/or $SiN_x$. A gate electrode 14 is disposed at a predetermined region overlying the gate insulating layer 13 and is connected to a gate line (not shown) for applying a signal which turns on or off the TFT.

An interlayer insulating layer 15 is formed on the gate electrode 14 in such a way that the source and drain electrodes 161 and 162 respectively contact the source and drain regions 121 and 122 of the active layer 12 via a contact hole. The TFT formed in this way is covered and protected by a passivation layer 17.

The passivation layer 17 may be composed of a single or multiple layers of an inorganic and/or organic material. Examples of the inorganic material may include $SiO_2$, silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), barium strontium titanate (BST), and lead zirconate titanate (PZT). The organic material may be a commercially available polymer, such as polymethylmethacrylate (PMMA) or polystyrene (PS), a polymer derivative containing a phenol group, an acryl-based polymer, an imide-based polymer, an arylether-based polymer, an amide-based polymer, a fluorine-based polymer, a p-xylene-based polymer, a vinyl alcohol-based polymer, or a mixture thereof. The passivation layer 17 may be formed from a stack of inorganic and organic insulating layers.

The OLED is disposed on the passivation layer 17. The OLED includes a first electrode overlying the passivation layer 17, a second electrode 22 facing the first electrode 21, and an intermediate layer 23 sandwiched between the first and second electrodes 21 and 22. The display apparatus 1 is classified into a bottom emission type, a top emission type, and a dual emission type depending on the direction in which light is emitted. When the display apparatus 1 is a bottom emission type, the first electrode 21 and the second electrode 22 are a transparent electrode and a reflective electrode, respectively. When the display apparatus 1 is a top emission type, the first and second electrodes 21 and 22 are a reflective electrode and a semi-transparent electrode, respectively.

When the first electrode 21 acts as a positive electrode, the first electrode 21 is formed of a material having a high work function such as indium tin oxide (ITO), indium zinc oxide (IZO), zinc oxide (ZnO), or indium oxide ($In_2O_3$). The first electrode 21 may be patterned in an island shape corresponding to each pixel, and be connected to the drain electrode 162 to receive current.

A pixel defining layer (PDL) 19 is formed on the first electrode so as to cover the first electrode 21. A predetermined aperture is formed in the PDL 1, and the intermediate layer 23 is formed in a region defined by the aperture as described below.

When the second electrode 22 acts as a negative electrode, the second electrode 22 may be formed of a material having a low work function, such as lithium (Li), calcium (Ca), lithium fluoride (LiF)/Ca. LiF/aluminum (Al), Al, magnesium (Mg), or silver (Ag). The second electrode 22 may be disposed over a light-emitting area in which an image is displayed and be connected to an external terminal (not shown) to receive power. The first and second electrodes 21 and 22 may have opposite polarities.

The intermediate layer 23 includes an organic light-emitting layer that generates light. The organic light-emitting layer may be formed of a polymeric or low molecular weight organic material. When the organic light-emitting layer is formed of a low molecular weight organic material, a hole transport layer (HTL) and a hole injection layer (HIL) are stacked on each other in a direction toward the first electrode 21 with respect to the organic light-emitting layer. An electron transport layer (ETL) and an electron injection layer (EIL) are stacked on each other in a direction toward the second electrode 22. In addition to the HTL, the HIL, the ETL, and the EIL, various other layers may be stacked as needed.

When the OLED is a full-color OLED, the organic light-emitting layer may be patterned to have red, green, and blue light-emitting layers of red, green, and blue sub-pixels, respectively.

The organic light-emitting layer may has a multi-layered structure in which red, green, and blue light-emitting layers are stacked on one another, or a single layered structure containing red, green, and blue light-emitting materials. The OLED having the red, green, and blue light-emitting layers further includes red, green, and blue color filters, thereby achieving full color emission.

The OLED is sealed by the sealing film 30 and protected from invasion of external moisture and air. The sealing film may have a thin film form. For example, the sealing film 30 may be formed from alternate stacking of layers of an inorganic material such as silicon oxide ($SiO_x$) or $SiN_x$ and an organic material such as epoxy or polyimide. However, the sealing film 30 is not limited thereto, and may contain low melting glass.

Subsequently, an upper protective film 40 is formed on the sealing film 30 and prevents damage to the sealing film 30 during a process of detaching the carrier substrate 100. The upper protective film 40 is removed after the carrier substrate 100 is detached.

When the display apparatus 1 is completed, the carrier substrate 100 is detached from the display apparatus 1. Detaching the carrier substrate 100 includes ablation and removing the carrier substrate 100.

For ablation, an interface between the carrier substrate 100 and the plastic substrate 10 made of polyimide is irradiated with light having a predetermined energy density ($mJ/cm^2$). Upon irradiation with the light having the predetermined energy density, polyimide polymer then absorbs the light to break conjugated polymer chains, thereby causing ablation. Thereby, an ablation layer (101 in FIG. 5) is formed at the interface between the plastic substrate 10 and the carrier substrate 100.

An apparatus 200 for ablating a substrate and a method for ablating the substrate using the apparatus 200 will now be described with reference to FIGS. 5 through 10. The apparatus 200 may help reduce defects caused due to excessive detachment or a failure in detachment of the carrier substrate 100.

Figure 5:
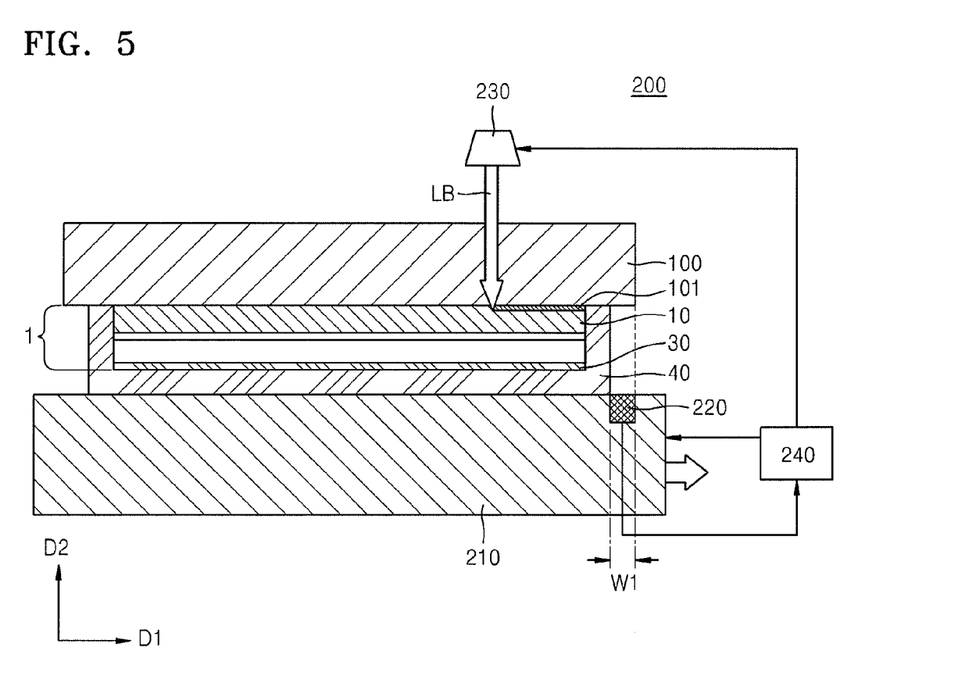
FIG. 5 schematically illustrates an apparatus for ablating a substrate according to an embodiment.
Figure 6:
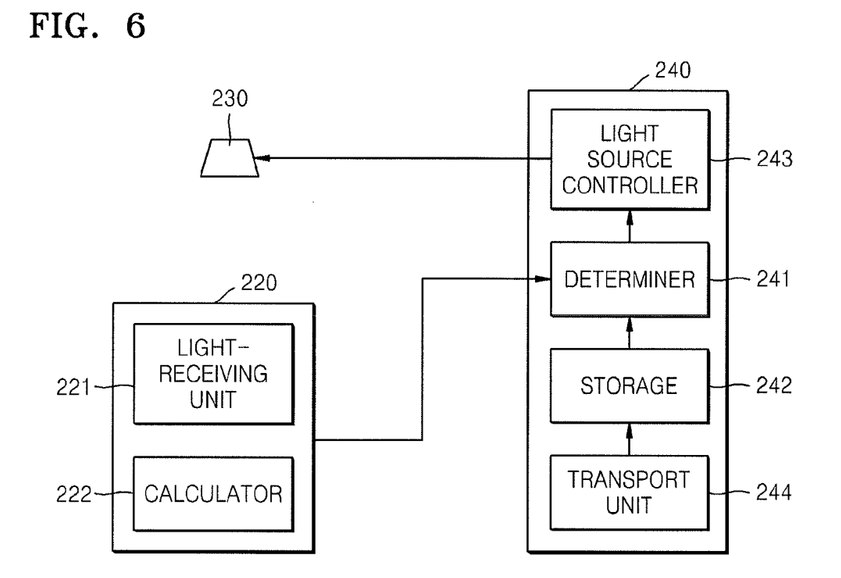
FIG. 6 is a detailed block diagram of the control unit and the measuring unit shown in FIG. 5.
Figure 7:
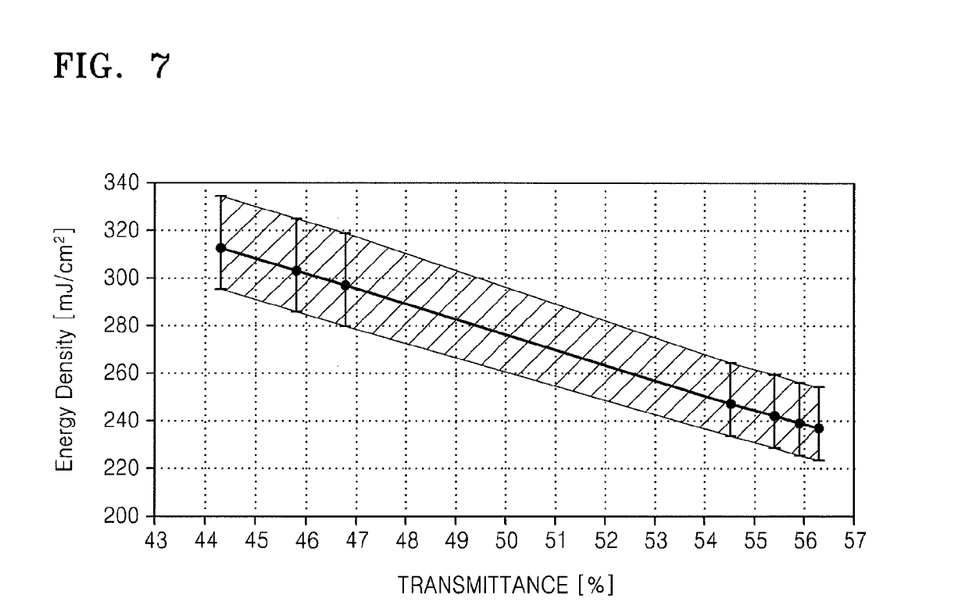
FIG. 7 is a graph illustrating a relationship between transmittance of a carrier substrate and energy density of light sufficiently high to normally detach a carrier substrate.
Figure 8:
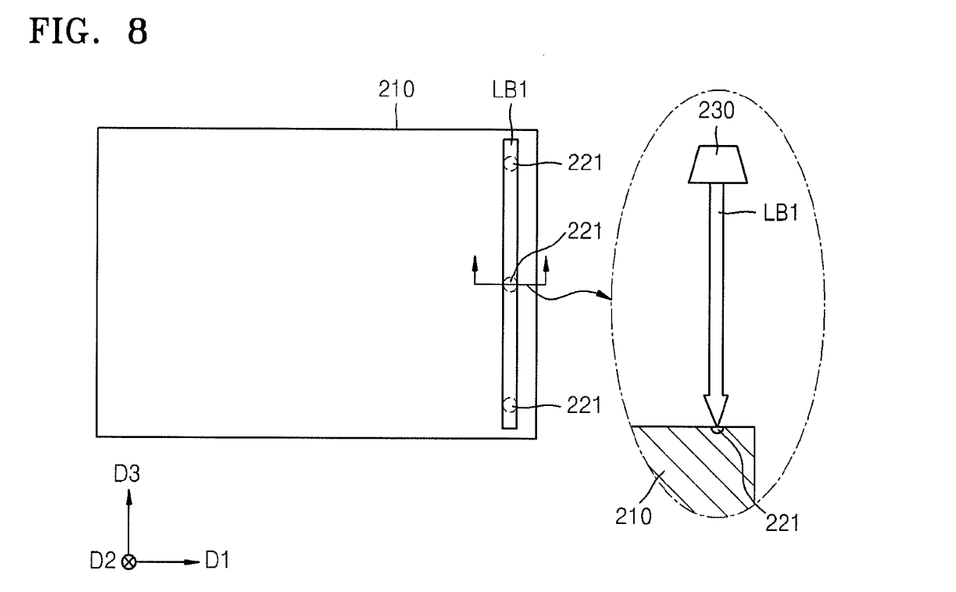
FIGS. 8 through 10 schematically illustrate a method of ablating a substrate using the apparatus for ablating a substrate according to an embodiment.
Figure 9:
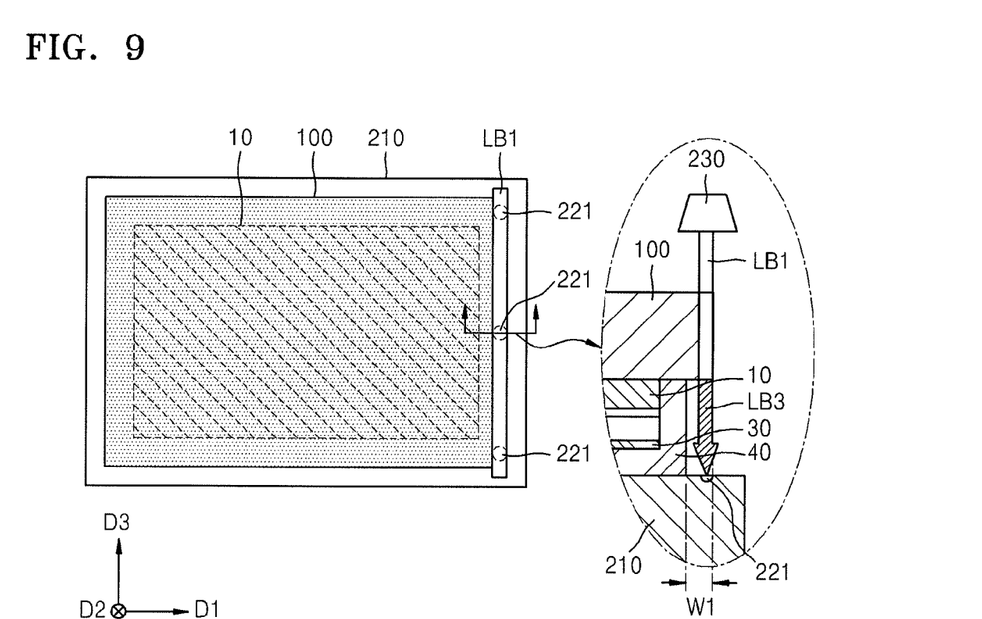
Figure 10:
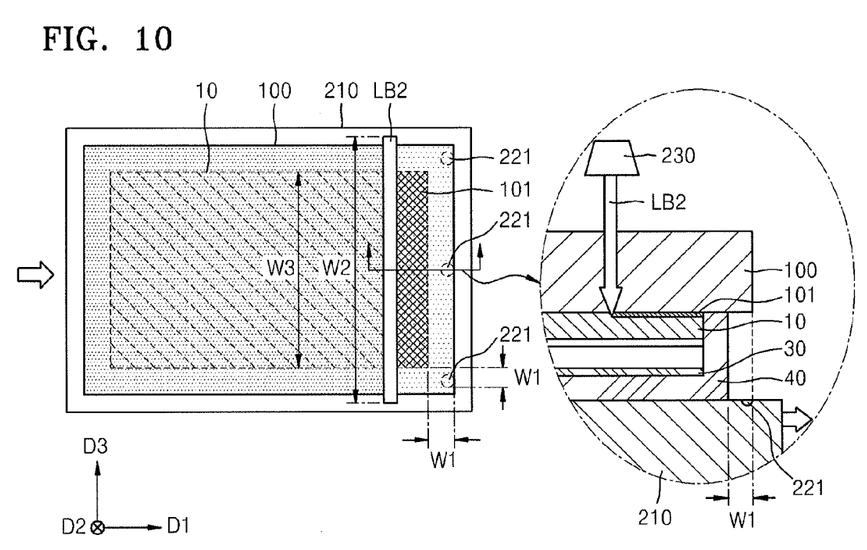

FIG. 5 schematically illustrates the apparatus 200 for ablating a substrate according to an embodiment. FIG. 6 is a detailed block diagram of a control unit 240 and a measuring unit 220 in the apparatus 200 of FIG. 5. FIG. 7 is a graph illustrating a relationship between transmittance of a carrier substrate and energy density of light sufficient to normally detach a carrier substrate. FIGS. 8 through 10 schematically illustrate a method of a carrier substrate using the apparatus 200 for ablating a substrate according to an embodiment.

In the example embodiment shown in FIGS. 5 and 6, the apparatus 200 includes a stage 210 on which a display apparatus 1 having a carrier substrate 100 attached thereto is located, a light source unit 230 emitting light toward the stage 210, a measuring unit 220 measuring transmittance of the carrier substrate 100, and a control unit 240 controlling the light source unit 230 to emit light for ablating a substrate according to the measured transmittance of the carrier substrate 100. The apparatus 200 may be disposed within a chamber (not shown) and shielded from an external environment.

The stage 210 has a flat top surface, and the display apparatus 1 with the carrier substrate 100 attached thereto is disposed on the flat top surface so that the carrier substrate 100 and an upper protective film 40 face the light source unit 230 and the stage 210, respectively.

The stage 210 may move in at least one direction D1 relative to the light source unit 230 using a transport unit 244, so that a light beam LB is consecutively emitted along one direction of the display apparatus 1. However, embodiments are not limited thereto, and the transport unit 244 may move the stage 210 and light source unit 230 relative to each other. Thus, the light source unit 230 may move in an opposite direction −D1 to the one direction +D1 in which the stage 210 moves.

The light source unit 230 emits the light beam LB toward the carrier substrate 100 and the display apparatus 1 on the stage 210. The light beam LB may be a laser beam that is amplified by the process of stimulated emission, such as an ultraviolet laser beam, a visible laser beam, or an infrared laser beam. The light beam LB may be an excimer laser beam with a wavelength of about 308 nm because glass has high transmittance with respect to the excimer laser beam and the use of an excimer laser beam facilitates ablation of polyimide. The light source unit 230 includes a light source (not shown) such as an arc lamp or a light emitting device (LED) and an optical system (not shown) for converting initial light generated by the light source into light having a line beam shape.

The light source unit 230 emits at least first and second light beams LB1 and LB2. The first beam LB1 is used for measuring the transmittance of the carrier substrate 100 while the second beam LB2 has an energy density corresponding to the transmittance of the carrier substrate 100 measured with the first light beam LB1. In other words, the second light beam LB2 is determined according to a feedback from the result of measurement using the first light beam LB1.

The first light beam LB1 may have a line beam shape, but is not limited thereto. The first light beam LB1 may have a point shape corresponding to a location of a light-receiving unit 221. The first light beam LB1 is used for measuring the transmittance of the carrier substrate 100, and thus does not have a specific energy density.

The measuring unit 220 receives the first light beam LB1 to measure the transmittance of the carrier substrate 100. The measuring unit 220 includes the light-receiving unit 221. The light-receiving unit 221 receives the first light beam LB1 emitted by the light source unit 230 and a third light beam LB3 generated after the first beam LB1 is transmitted through the carrier substrate 100. The third light beam LB3 is a transmitted light beam. For example, the light-receiving unit 221 may be a photo sensor that measures a light intensity and converts the light intensity into an electrical signal. The light-receiving unit 221 may be disposed on the stage 210, and in particular, on a region of the stage 210 overlapping a portion of the carrier substrate 100 projecting out when the display apparatus 1 with the carrier substrate 100 attached thereto is positioned on the stage 210. This facilitates measurement of the transmittance of the carrier substrate 100 without needing to change the position of the stage 210. The number and shape of light-receiving units 221 is not limited.

The measuring unit 220 may further include a calculator 222 that calculates the transmittance of the carrier substrate 100 by using the first light beam LB1 and the third light beam LB3 obtained from the light-receiving unit 221.

The transmittance of light is defined as a percentage (%) of incident beam which is transmitted through the carrier substrate 100, i.e., a ratio of the intensity of the transmitted beam to that of the incident beam. The intensity of a beam may represent energy (J) of the beam. Because definitions of transmittance and methods of measuring the transmittance are well known in the art, detailed descriptions thereof will be omitted.

The control unit 240 determines the second light beam LB2 based on the light transmittance obtained by the measuring unit 220. More specifically, the control unit 240 includes a determiner 241 which determines an energy density of a beam, which is sufficient to ablate the polyimide plastic substrate 10, according to the transmittance of the carrier substrate 100. As the transmittance of the carrier substrate 100 increases, the energy density sufficient to normally detach the substrate 10 decreases. Conversely, as the transmittance of the carrier substrate 100 decreases, the energy density increases. Data related to an inversely proportional relationship between the transmittance of the carrier substrate 100 and the energy density sufficient to ablate the substrate 10 are stored in a storage 242. For example, transmittances of the carrier substrate 100 and corresponding energy densities of a beam may be mapped to each other and stored in a table.

In order to ablate the polyimide plastic substrate 10 and separate it from the carrier substrate 100, the emitted second light beam LB2 has an energy density sufficient to break up a combination between polyimide polymer chains for ablation. If the second light beam LB2 has an extremely low energy density, the carrier substrate 100 may not be detached, which makes a subsequent process difficult. Furthermore, if the carrier substrate 100 which undergoes a failure in detachment is forcibly removed, the carrier substrate 100 may be broken, or the plastic substrate 10 may be damaged. On the other hand, if the second light beam LB2 has an excessively high energy density, excessive detachment may occur, and the plastic substrate 10 may become burned and sooty, which may cause contamination in equipment. Some soot may remain to cause defects in end products.

Since the second light beam LB2 for ablation is transmitted through the carrier substrate 100, the intensity (energy) of a beam reaching an interface between the carrier substrate 100 and the plastic substrate 10 may change, relative to the intensity (energy) of a beam emitted by the light source unit 230, depending on the transmittance of the carrier substrate 100. The energy densities of the second light beam LB2 sufficient for normal detachment according to varying transmittances of the carrier substrate 100 may be experimentally qualified. 'Normal detachment' means a state in which a failure in detachment or excessive detachment does not occur. The failure in detachment refers to a state in which a residual layer of polyimide is not uniform when a surface of the plastic substrate 10 is observed by using reflected light after separation from the carrier substrate 100. The excessive detachment refers to a state in which soot is observed on a surface of the plastic substrate 10 separated from the carrier substrate 100. The failure in detachment and the excessive detachment may be observed with a naked eye.

After emitting a beam having a predetermined energy density onto the carrier substrate 100 to which the plastic substrate 10 is bonded, the carrier substrate 100 and the plastic substrate 10 were experimentally observed for normal detachment. Furthermore, by varying an energy density and the type of the carrier substrate 100, the carrier substrate 100 and the plastic substrate 10 were repeatedly observed for normal detachment. As illustrated in FIG. 7, an energy density of the second light beam sufficient to normally detach the carrier substrate 100 with respect to the transmittance of the carrier substrate 100 is obtained from the results of the above-described experiments. As can be seen from FIG. 7, when the carrier substrate 100 has a transmittance of about 56%, the second light beam may have an energy density of about 220 mJ/cm$^2$ to about 260 mJ/cm$^2$.

Embodiments are not limited to the values illustrated in FIG. 7, and an energy density of a beam for ablating a carrier substrate may be determined according to a transmittance of the carrier substrate.

A method of ablating a carrier substrate 100 by using the apparatus 200 of FIG. 5 will now be described with reference to FIGS. 8 through 10.

Referring to FIG. 8, the stage 210 is moved to a first position so that the light-receiving unit 221 receives light emitted by the light source unit 230. When the stage 210 is at the first position, the light source unit 230 emits a first light beam LB1, and the light-receiving unit 221 receives the first light beam LB1. The first light beam LB1 received by the light-receiving unit 221 is emitted directly from the light source unit 230 without being transmitted through the carrier substrate 100. Thus, during the operation illustrated in FIG. 8, the display apparatus 1 with the carrier substrate 100 attached thereto may not be disposed on the stage 210.

Next, referring to FIG. 9, the display apparatus 1 with the carrier substrate 100 attached thereto and facing the light source unit 230 is disposed on the stage 210 so as to face the stage 210. The stage 210 maintains the first position illustrated in FIG. 8, and the light-receiving unit 221 receives a third light beam LB3. The third light beam LB3 refers to a light beam (which may be generated after the first light beam) emitted by the light source unit 230 and transmitted through the carrier substrate 100. The first light beam LB1 and the third light beam LB3 are used to calculate a transmittance of the carrier substrate 100.

An energy density of the second light beam LB corresponding to the transmittance of the carrier substrate 100 is determined, and the light source unit 230 is controlled to emit the second light beam LB2 having the determined energy density. The transport unit 244 is controlled to move the stage 210 relative to the light source unit 230.

Referring to FIG. 10, the stage 210 moves in one direction D1 relative to the light source unit 230, and the light source unit 230 emits the second light beam LB2 onto an interface between the carrier substrate 100 and the plastic substrate 10 so as to ablate and separate the plastic substrate 10 and the carrier substrate 100. When the second light beam LB2 is transmitted through the transparent carrier substrate 100 and reaches a surface of the polyimide plastic substrate 10, the ablation layer 101 is formed at the interface between the carrier substrate 100 and the plastic substrate 10, thereby separating the carrier substrate 100 and the plastic substrate 10 from each other. Since the second light beam LB2 has a line beam shape and a width W2 in a direction D3 greater than a width W3 of the display apparatus 1, the second light beam LB2 may be scanned only once to ablate the entire bonded area of the carrier substrate 100. The second light beam LB2 may be substantially perpendicular to the direction D1 in which the stage 210 moves.

As described above, the apparatus 200 and the method of ablation using the apparatus 200 may be used to determine a second light beam sufficient for normal detachment prior to ablation and detachment of the carrier substrate, so as to reduce the occurrence of defects in the ablation and detachment. Automatic ablation of the carrier substrate may be achieved, and thus process time and costs may be reduced.

Figure 11:
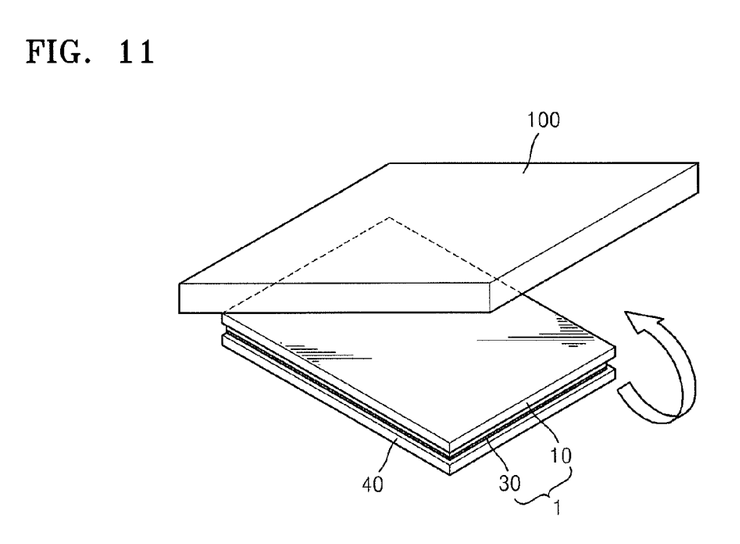
FIGS. 11 and 12 schematically illustrate steps of the method of manufacturing the display apparatus, which are subsequent to the steps illustrated in FIGS. 1 through 3.
Figure 12:
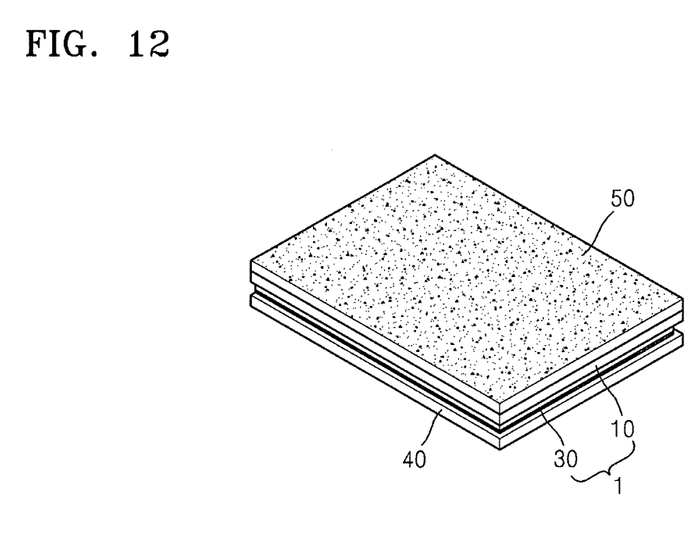

FIGS. 11 and 12 schematically illustrate steps of the method of manufacturing the display apparatus 1, which are subsequent to the steps illustrated in FIGS. 1 through 3.

Referring to FIG. 11, after completing ablation, the carrier substrate 100 is removed. When normal detachment occurs, the carrier substrate 100 is easily separated from the plastic substrate 10, a residual layer on a surface of the plastic substrate 10 is uniform, and soot does not remain on the surface of the plastic surface 10.

Subsequently, referring to FIG. 12, a lower protective film 50 is attached onto the exposed plastic substrate 10. Like the upper protective film 40, the lower protective film 50 prevents damage to the plastic substrate 10 and supports the display apparatus 1 so as to facilitate movement of products. The upper and lower protective films 40 and 50 are release films which are subsequently removed.

Although not shown, when a plurality of display apparatuses 1 are disposed on the plastic substrate 10, the plastic substrate 10 may be cut into individual display apparatuses 1. The upper protective film 40 is removed, an optical film is attached, and the lower protective film 50 is removed, thereby completing the display apparatus 1.

By way of summation and review, a plastic substrate for an OLED may be supported during the fabrication of a flat panel display because of the high flexibility of the plastic substrate. Therefore, the plastic substrate may be formed on a carrier substrate made of glass during the fabrication of the flat panel display, and after the fabrication, the carrier substrate may be detached by irradiating a laser beam. If a laser beam having extremely high energy is irradiated for detachment of a carrier substrate, an interface between a carrier substrate and a plastic substrate may become burned and sooty, which may cause contamination of equipment in subsequent processes. Conversely, if an extremely low energy laser beam is irradiated, the carrier substrate may fail to be readily detached. Furthermore, such a failure may not be detected until the carrier substrate is detached from a plastic substrate, thereby resulting in an increase of manufacturing failure rate.

As described above, embodiments may provide an apparatus and method for ablating a substrate for normally detaching from the carrier substrate, and a method of manufacturing a display apparatus. The apparatus and method for ablation may determine light sufficient for normal detachment according to the transmittance of the carrier substrate so as to reduce a failure rate in detachment from the carrier substrate.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A method of ablating a substrate of a display apparatus, the method comprising:
   receiving a first light at a light receiving unit when the stage is located at a first position;
   positioning a carrier substrate on a stage, the carrier substrate having attached thereto the display apparatus;
   measuring a transmittance of the carrier substrate;
   determining a second light sufficient to ablate the substrate of the display apparatus according to the measured transmittance of the carrier substrate; and
   emitting the second light from a light source unit to ablate the substrate of the display apparatus,
   wherein the measuring of the transmittance includes:
      receiving a third light at the light receiving unit, the third light being generated after the first light, the third light being transmitted through the carrier substrate when the stage is located at the first position, and calculating the transmittance of the carrier substrate by using the first light and the third light.

2. The method as claimed in claim 1, wherein the stage moves relative to the light source unit.

3. The method as claimed in claim 2, wherein, in the ablating of the substrate of the display apparatus, the second light is emitted as the stage moves in a first direction from the first position and ablates the substrate of the display apparatus.

4. The method as claimed in claim 1, wherein, in the determining of the second light, an energy density of the second light sufficient to ablate the substrate of the display apparatus is determined according to the transmittance of the carrier substrate.

5. The method as claimed in claim 4, wherein the second light is emitted on an interface between the carrier substrate and the substrate of the display apparatus.

6. The method as claimed in claim 1, wherein one of the first light and the second light is incident from the carrier substrate.

7. The method as claimed in claim 1, wherein the second light has a line beam shape and a width greater than or equal to a width of the display apparatus.

8. A method of manufacturing a display apparatus, the method comprising:

forming a plastic substrate on a carrier substrate;

fabricating a display apparatus by forming an organic light-emitting device on the plastic substrate;

receiving a first light from a light receiving unit when the stage is located at a first position;

positioning the display apparatus with the carrier substrate attached thereto on a stage;

measuring a transmittance of the carrier substrate;

determining a second light sufficient to ablate the plastic substrate according to the measured transmittance of the carrier substrate; and emitting the second light from a light source unit to ablate the plastic substrate, wherein the measuring of the transmittance includes:

receiving a third light at the light receiving unit, the third light being generated after the first light, the third light being transmitted through the carrier substrate when the stage is located at the first position, and calculating the transmittance of the carrier substrate by using the first light and the third light.

9. The method as claimed in claim 8, wherein the stage moves relative to the light source unit.

10. The method as claimed in claim 9, wherein, in the ablating of the plastic substrate, the second light is emitted as the stage moves in a first direction from the first position and ablates the plastic substrate.

11. The method as claimed in claim 8, wherein, in the determining of the second light, an energy density of the second light sufficient to ablate the plastic substrate is determined according to the transmittance of the carrier substrate.

12. The method as claimed in claim 9, wherein the second light is emitted on an interface between the carrier substrate and the plastic substrate.

13. The method as claimed in claim 8, wherein the fabricating of the display apparatus further includes forming a sealing film for sealing the organic light-emitting device and forming a protective film on the sealing film.

* * * * *